United States Patent
Mandelman et al.

(10) Patent No.: US 6,376,324 B1
(45) Date of Patent: Apr. 23, 2002

(54) COLLAR PROCESS FOR REDUCED DEEP TRENCH EDGE BIAS

(75) Inventors: Jack A. Mandelman, Stormville; Ramachandra Divakaruni, Somers; Carl J. Radens, LaGrangeville, all of NY (US); Ulrike Gruening, Munich (DE); Akira Sudo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/602,969

(22) Filed: Jun. 23, 2000

(51) Int. Cl.$^7$ ............................................... H01L 21/20
(52) U.S. Cl. ........................ 438/386; 257/301; 257/302; 257/303; 438/234
(58) Field of Search ................................ 438/243, 248, 438/249, 386, 391; 257/301–305

(56) References Cited

U.S. PATENT DOCUMENTS

| 5,395,786 A | 3/1995 | Hsu et al. |
| 5,498,889 A | 3/1996 | Hayden |
| 5,576,566 A | 11/1996 | Kenney |
| 5,723,889 A | 3/1998 | Choi et al. |
| 5,770,876 A | 6/1998 | Lam et al. |
| 5,945,704 A | 8/1999 | Schrems et al. |
| 6,008,103 A | * 12/1999 | Hoepfner .................. 438/386 |
| 6,100,130 A | * 8/2000 | Iba et al. .................. 438/386 |

OTHER PUBLICATIONS

IBM Technical Disclosure Bulletin, vol. 34, No. 10B, Mar. 1992 entitled "Noise–Suppression Techniques for Buried –Plate Trench Memory Array" pp. 9–13.

* cited by examiner

Primary Examiner—David Nelms
Assistant Examiner—Dung A Lee
(74) Attorney, Agent, or Firm—Ira D. Blecker

(57) ABSTRACT

Disclosed is a method to provide a new deep trench collar process which reduces encroachment of strap diffusion upon array metal oxide semiconductor field effect transistors (MOSFET's) in semiconductor devices. The invention allows a reduced effective deep trench edge bias at the top of the deep trench, without compromising storage capacitance, by maximizing the distance between the MOSFET gate conductor and the deep trench storage capacitor.

16 Claims, 7 Drawing Sheets

COLLAR PROCESS FOR REDUCED DEEP TRENCH EDGE BIAS

BACKGROUND OF THE INVENTION

The present invention is directed to deep trench storage capacitors, and, more particularly, to dynamic random access memory cells in semiconductor devices.

Semiconductor devices, and memory devices in particular, typically employ capacitors for charge storage purposes. Many memory devices, such as dynamic random access memory (DRAM) cells, utilize capacitors wherein a bit of data is represented by a charge stored in the capacitor structure. Typically a DRAM cell comprises a transistor coupled to a capacitor. Referring to FIG. 23, the transistor includes two diffusion regions separated by a channel, above which is located a gate conductor (GC). One type of capacitor commonly employed in DRAM cells is the deep trench (DT) capacitor. A DT capacitor is a three dimensional structure formed in a silicon substrate. Typically a deep trench is formed in the silicon substrate using a conventional technique such as reactive ion etching (RIE). The trench is typically filled with n-type doped polysilicon which serves as one plate of the capacitor, usually referred to as the "storage node". The second plate of the capacitor, usually referred to as the "buried plate", is typically formed by outdiffusion of an n-type doped region surrounding the lower portion of the trench. A node dielectric layer is provided to separate the buried plate and the storage node thereby forming the capacitor. A node diffusion region, also referred to as the node junction, couples the capacitor to the transistor. The node junction is formed from the outdiffusion of dopants from the doped polysilicon into the silicon substrate through a buried strap provided above the doped polysilicon and connecting the doped polysilicon to the silicon substrate. Applying an appropriate voltage to the GC allows current to flow through the channel between the diffusion regions to form a connection between the capacitor and the bitline. Typically a dielectric collar is formed at an upper portion of the trench to prevent leakage of the node diffusion region to the buried plate which would degrade the retention time of the cell. A shallow trench isolation (STI) is provided in a top portion of the trench to isolate the DRAM cell from other cells in the device.

As minimum feature size and cell architecture are scaled down, robust design points for DRAM cells utilizing planar metal oxide semiconductor field effect transistors (MOSFETs) and DT capacitors are increasingly difficult to achieve. Scalability of the planar MOSFET in the environment is severely limited by gate conductor to deep trench (GC-DT) overlay tolerance and buried strap outdiffusion. One manifestation of the scalability difficulties of planar DRAM MOSFETs is degradation of the retention time, due to increased node junction leakage resulting from the very high channel doping concentrations required to suppress short-channel effects. This is particularly true for designs currently being considered for the 0.15 $\mu$m generation. The viability of such DT cell designs having planar MOSFETs will be enhanced by reducing the encroachment of the strap diffusion upon the array MOSFET. Even a reduction of 10 nm would be significant.

With presently practiced DT collar processes, a local oxidation of silicon (LOCOS) collar is employed. The uses of an oxidized, rather than deposited, collar facilitates the filling of the trench and provides increased storage capacitance. However, due to the oxidation process a portion of the DT sidewall silicon is converted to SiO2. When the strap opening is formed, part of the collar is removed to provide a path for the outdiffusion of dopant from the DT polysilicon into the silicon substrate. Therefore the initial interface for the strap diffusion is moved closer to the array MOSFET by an amount which is equal to the amount of DT sidewall silicon consumed by the collar oxidation. In other words, the distance between the GC and the DT is reduced to less than its design nominal. For a 30 nm thick collar this additional DT edge bias amounts to approximately 12 nm/edge. The additional 12 nm of DT bias/edge significantly restricts the operable process window and puts additional pressure on tightening other process controls, such as GC-DT overlay and DT critical dimension (CD) tolerance, and GC CD tolerance and bias.

There are a number of methods proposed by others for forming a deep trench capacitor which employs a dielectric collar to prevent leakage of the node junction to the buried plate.

Schrems et al. U.S. Pat. No. 5,945,704, the disclosure of which is incorporated by reference herein, discloses an improved trench capacitor having a reduced surface roughness on the trench sidewalls. By lining the lower portion of the trench with an epitaxial layer of silicon, the roughness of the surface on which the node dielectric is formed is reduced. The invention does not disclose a new or novel method for providing the dielectric collar.

Hsu et al. U.S. Pat. No. 5,395,786, the disclosure of which is incorporated by reference herein, discloses a simplified process for forming a trench capacitor that reduces cost and increases process latitude by forming the trench collar in a single step. This method requires expanding the trench sidewalls horizontally by means of an isotropic etch and then growing an oxide layer to form the trench collar. This method consumes, i.e., oxidizes, trench sidewall and thereby decreases GC-DT gap, a disadvantage avoided by the present invention..

Lam et al. U.S. Pat. No. 5,770,876, the disclosure of which is incorporated by reference herein, discloses a process for forming a semiconductor trench capacitor with a first level aligned buried strap. The invention does not disclose a new or novel method for providing the dielectric collar.

Choi et al. U.S. Pat. No. 5,723,889, the disclosure of which is incorporated by reference herein, discloses a trench capacitor with a transistor stacked vertically on top of the trench capacitor, thereby reducing the total surface area occupied by the device. The invention does not disclose a new or novel method for providing a dielectric collar.

Kennedy, U.S. Pat. No. 5,576,566, the disclosure of which is incorporated by reference herein, discloses a semiconductor device with a buried strap and insulation structure aligned with a trench capacitor. The invention does not disclose a new or novel method for providing the dielectric collar.

Hayden, U.S. Pat. No. 5,498,889, the disclosure of which is incorporated by reference herein, discloses the incorporation of a storage capacitor in a static random access memory (SRAM) device to increase total storage node capacitance. The preferred embodiment forms the SRAM over a transistor in a vertical stack configuration. The invention does not disclose a new or novel method for providing a dielectric collar.

Notwithstanding the prior art there remains a need to reduce the encroachment of strap diffusion upon the array MOSFET. The present inventors have proposed a new DT collar process which reduces the effective DT edge bias. The invention also allows a negative DT edge bias, i.e., a smaller DT width, to be achieved at the top of the DT, without compromising storage capacitance.

Thus, a purpose of the present invention is to have a method for providing a DT collar process which reduces the effective DT edge bias. It is another purpose of the present invention to have a method for providing a DT collar process which allows a negative DT edge bias.

These and other purposes of the present invention will become more apparent after referring to the following description considered in conjunction with the accompanying drawings.

BRIEF SUMMARY OF THE INVENTION

The present invention discloses a new DT collar process which reduces the effective DT edge bias, i.e., maximizes the GC-DT gap. A first embodiment utilizes a thin epitaxial silicon (epi) layer with minimal crystal defects suitable for allowing a negative DT edge bias, i.e., a smaller DT width, to be achieved at the top of the DT, without compromising storage capacitance. The epi layer is deposited directly on the silicon trench sidewalls. Since it is not required that all of the epi layer be oxidized in order to form the dielectric collar, any non-consumed (unoxidized) portion of the epi layer is available to increase the GC-DT gap. A deep trench is formed having trench sidewalls in a semiconductor substrate. An oxidation barrier layer is formed conformally on the trench sidewalls. The trench is filled with a photoresist and the photoresist is removed to a predetermined depth in the trench. The oxidation barrier layer is removed to a predetermined depth in the trench to expose the trench sidewalls and the remaining photoresist is removed from the trench. A layer of silicon material is formed to the predetermined depth on the exposed trench sidewalls. A dielectric layer is formed on the silicon material layer to a predetermined depth to form a collar. The remaining oxidation barrier layer is then removed from the trench.

The second embodiment removes the need to use a selective epitaxial silicon layer. This process will not provide a negative DT edge bias, but is still an improvement over the prior art in that it will form the dielectric collar without consumption (oxidation) of the silicon trench sidewalls thereby maintaining the nominal design GC-DT gap. A deep trench having trench sidewalls is formed in a semiconductor substrate. A layer of silicon material is formed conformally on the trench sidewalls. An oxidation barrier layer is formed conformally on the layer of silicon material. The trench is filled with a photoresist and the photoresist is removed to a predetermined depth. The oxidation barrier layer is then removed to a predetermined depth in the trench. The remaining photoresist is removed from the trench. A layer of dielectric is formed on the layer of silicon material to a predetermined depth to form a collar. The remaining oxidation barrier layer is then removed from the trench.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing, according to the present invention, a method for forming a deep trench collar which reduces the effective deep trench edge bias.

A first embodiment of the invention will be described with reference to FIGS. 1 to 11.

Figure 1:
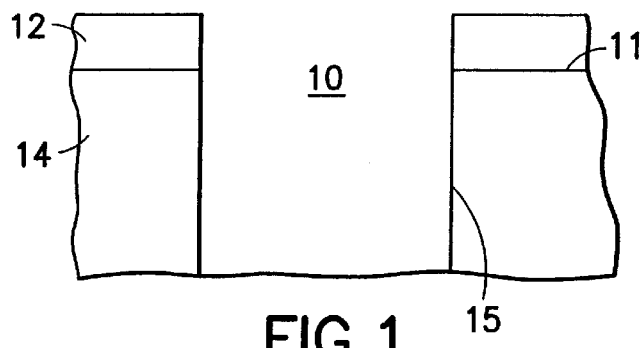
FIGS. 1–11 show in cross section a process in accordance with a first embodiment of the invention.

Referring to the Figures in more detail, and particularly referring to FIG. 1, there is shown a trench 10, having trench sidewalls 15, formed in a semiconductor substrate 14 in a customary manner such as reactive ion etching (RIE), with a surface pad 12 patterned using conventional techniques to define the region in which the trench 10 is to be formed. The surface pad 12 is typically a multilayer structure (not shown). In one typical embodiment of the surface pad 12 the semiconductor substrate 14 surface 11 has a thin silicon oxide layer typically 5 to 15 nm thick. A silicon nitride layer is deposited on the silicon oxide layer with a typical thickness of 100 to 200 nm followed by a hard mask layer comprised of a variety of materials such as tetra-ethyl-orthosilicate (TEOS) or boron-doped phospho-silicate glass (BPSG).

Figure 2:
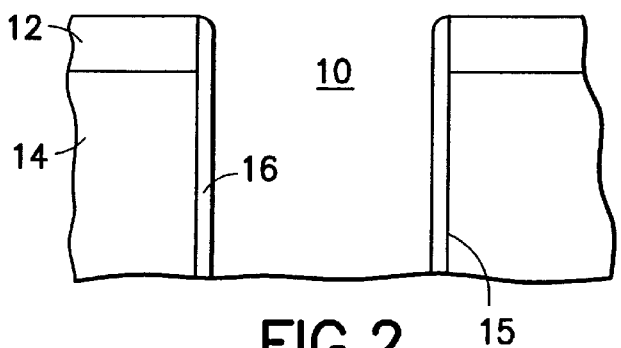

Referring to FIG. 2 an oxidation barrier layer 16 is formed conformally on the trench sidewalls 15. In one embodiment the oxidation barrier layer 16 is a nitride barrier layer. Other alternatives include silicon oxynitride. The oxidation barrier layer 16 may be formed by methods well known in the art, such as nitridization of oxide or chemical vapor deposition.

Figure 3:
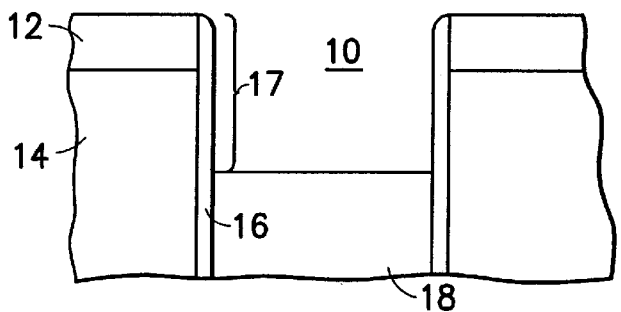

Referring to FIG. 3 the trench 10 is filled with photoresist 18 and the photoresist 18 is then removed by a dry isotropic etch (i.e., downstream etch) containing oxygen to a predetermined depth 17 in the trench 10. This predetermined depth 17 corresponds to where the bottom of the dielectric collar to be formed is desired.

Figure 4:
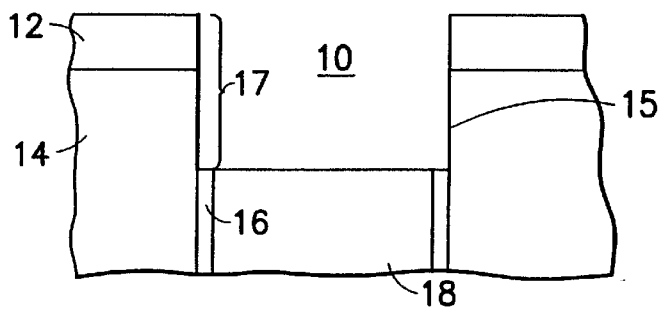

Referring to FIG. 4, the oxidation barrier layer 16 in the upper portion of the trench 10 not covered with photoresist 18, i.e., predetermined depth 17, is removed. This is accomplished by isotropic etch techniques well known in the art, such as wet etching in hydrofluoric ethylene glycol or hydrofluoric glycerol. The time and temperature of the etch are selected to remove the oxidation barrier. As an example, temperature may be at room temperature with an etching time of approximately 2.5 minutes for 50 Å removal of the oxynitride barrier layer (includes significant overetch).

Figure 5:
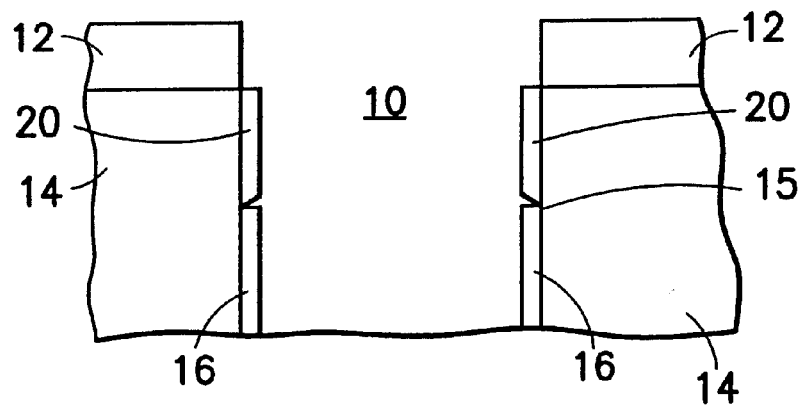

Referring to FIG. 4 and FIG. 5, the remaining photoresist 18 is removed by an oxygen plasma from the trench 10 and a silicon material layer 20 is selectively formed on the exposed silicon trench walls 15. In one embodiment the silicon material layer 20 is a layer of epitaxial silicon. Another embodiment may utilize the selective deposition of an amorphous (i.e., -silicon) silicon layer. Since the epitaxial layer is very thin, it is expected that propagation of crystal defects into the substrate is minimal.

Figure 6:
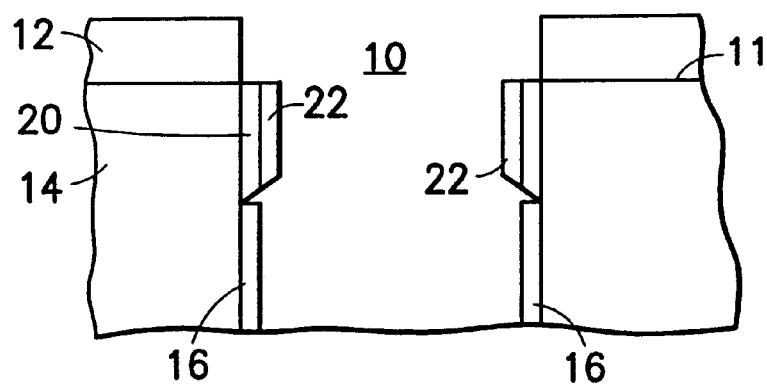

Referring to FIG. 5 and FIG. 6 a layer of dielectric is formed on the silicon material layer 20 to form a dielectric collar 22. In one embodiment the epitaxial silicon layer is oxidized to form the dielectric collar. This can be accomplished by a variety of possible processes including wet or dry oxidation.

Figure 7:
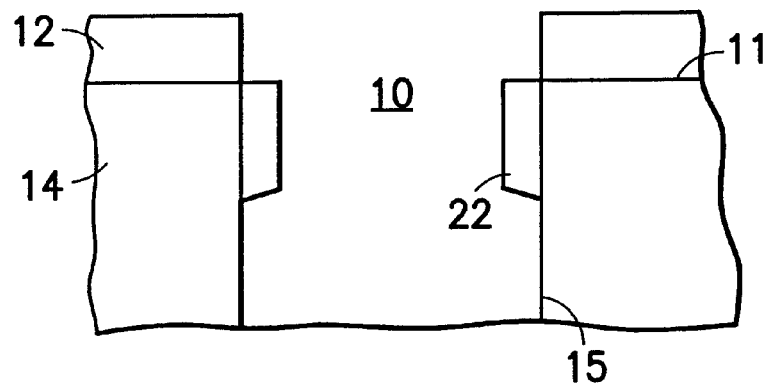

Referring to FIG. 6 and FIG. 7 the remaining oxidation barrier layer 16 in the trench 10 is removed by means of an isotropic etch such as hydrofluoric glycerol to expose trench sidewalls 15.

Figure 8:
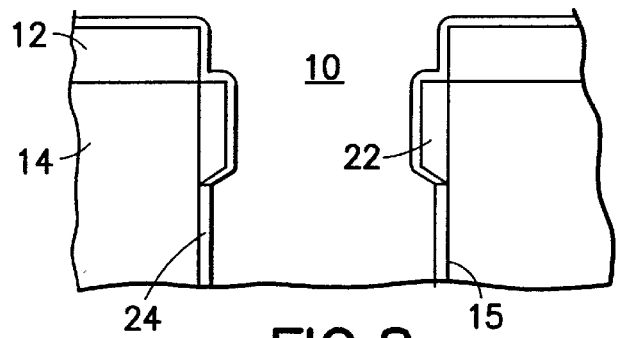

Referring to FIG. 8, a dopant source layer 24 is formed conformally on the exposed trench sidewalls 15, dielectric collar 22 and surface pad 12 by one of a number of alternative processes, preferably by chemical vapor deposition (CVD). In one embodiment the dopant source layer 24 is an arsenic doped glass (ASG) deposited by CVD. As an alternative to using a solid dopant source (i.e., ASG), the exposed trench sidewalls may be exposed to a gaseous dopant source such as Arsine ($AsH_3$) at elevated temperature.

Figure 9:
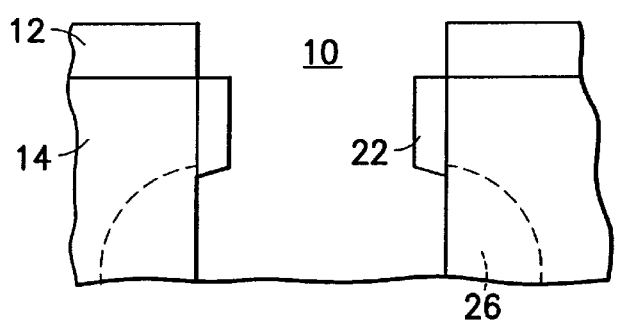

Referring to FIG. 8 and FIG. 9, outdiffusion of the dopant layer 24, into the semiconductor substrate 14, forms the buried plate electrode 26. Outdiffusion of the dopant layer 24 will only occur on the exposed trench sidewalls 15. The buried plate electrode 26 thus formed is self-aligned to the dielectric collar 22. The remaining non diffused dopant layer 24 is subsequently removed. This can be accomplished by means of either a wet or dry isotropic etch process well known in the art.

Figure 10:
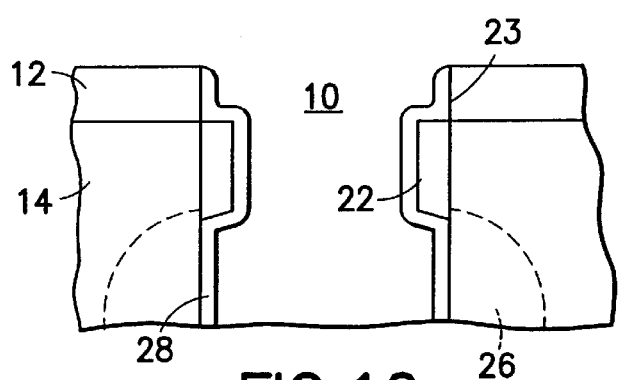

Referring to FIG. 10 the node dielectric 28, also referred to as the capacitor trench dielectric, is formed on the trench sidewalls 15, dielectric collar 22 and surface 23 of surface pad 12. This is accomplished using a nitrogen containing gas, such as ammonia, to form a thin nitride layer. The surface of the nitride layer is then oxidized by means of an elevated oxidizing bake. Oxidation may be by rapid thermal oxidation (RTO) or by furnace anneal in a temperature range of 800–1100° C. in dry $O_2$ or a wet $O_2$ ambient. The thickness of the node dielectric 28 is typically 20 to 50 Å.

Figure 11:
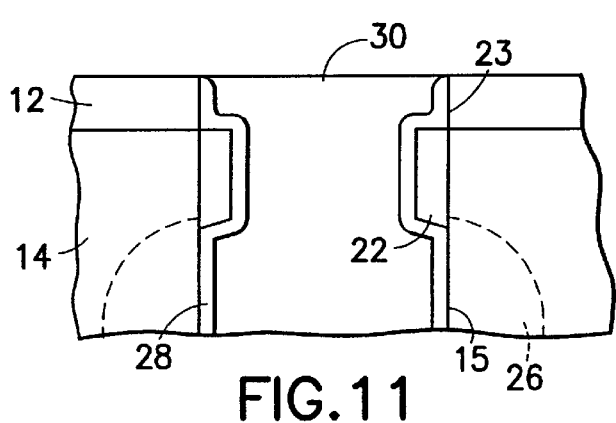

Referring to FIG. 10 and FIG. 11, the trench 10 is filled with a doped polysilicon 30 which forms the inner electrode, also referred to as the storage node, thereby completing the DT capacitor. This is accomplished by means of chemical vapor deposition processes (CVD) well known in the art for high aspect ratio applications.

A second embodiment of the invention will now be discussed with reference to FIGS. 12 to 22.

Figure 12:
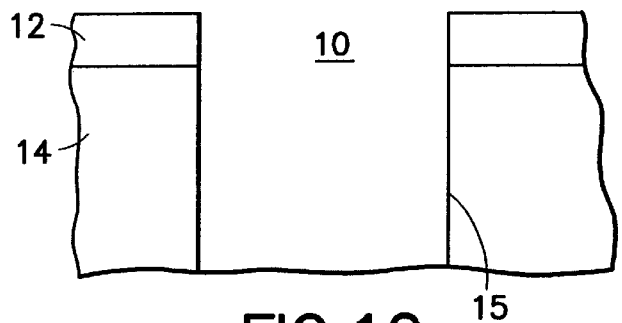
FIGS. 12–22 show in cross section a process in accordance with a second embodiment of the invention.

Referring to FIG. 12, there is shown a trench 10, having trench sidewalls 15, formed in a semiconductor substrate 14 in a customary manner, such as reactive ion etching (RIE), with a resulting surface pad 12 patterned using conventional techniques to define the region in which the trench 10 is to be formed. Surface pad 12 can be a multilayer structure as discussed previously.

Figure 13:
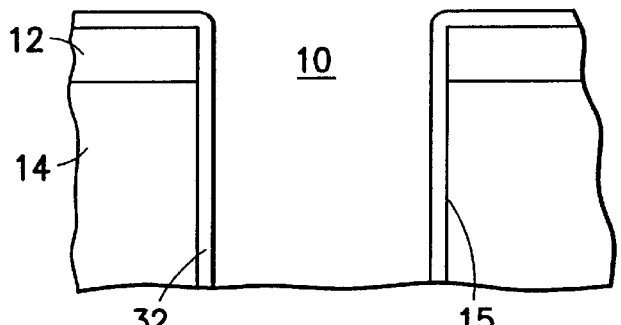

Referring to FIG. 13 a silicon material layer 32 is formed conformally on the trench sidewalls 15. The silicon may be amorphous (α), polysilicon, or epitaxial. The layer should be undoped or lightly P- doped to avoid contaminating the deep trench sidewall surface 15 which must provide isolation between the node diffusion and the buried-layer/buried-plate, to avoid leakage.

Figure 14:
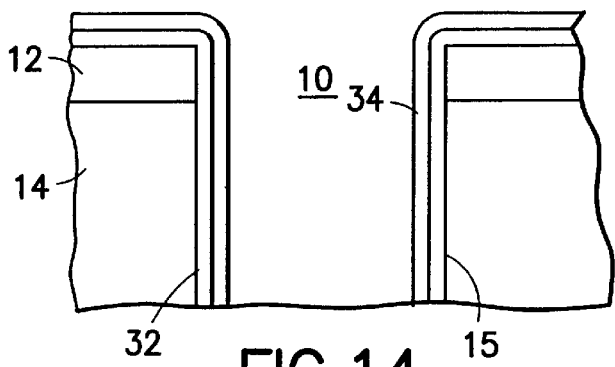

Referring to FIG. 14 an oxidation barrier layer 34 is formed conformally in the trench 10 on the layer of silicon material 32 by means well known in the art such as nitridization of silicon or by chemical vapor deposition. In one embodiment the oxidation barrier layer 16 is a layer of nitride. Other alternatives include silicon oxynitride.

Figure 15:
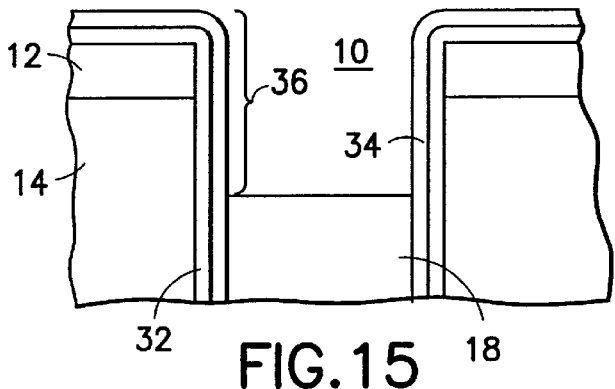

Referring to FIG. 15 the trench 10 is filled with photoresist 18 and the photoresist 18 is then removed by an oxygen plasma to a predetermined depth 36 in the trench 10. This predetermined depth corresponds to where the bottom of the dielectric collar to be formed is desired.

Figure 16:
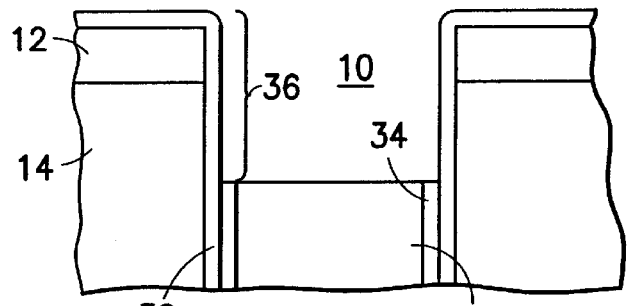
Figure 17:
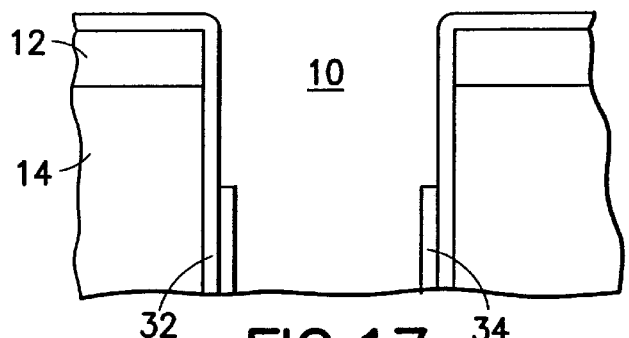

Referring to FIG. 16 and FIG. 17, the exposed portion of the oxidation barrier layer 34 is removed by means of an isotropic etch such as hydrofluoric ethylene glycol or hydrofluoric glycerol. The remaining photoresist 18 is removed from the trench 10 using a conventional etch technique such as an oxygen plasma.

Figure 18:
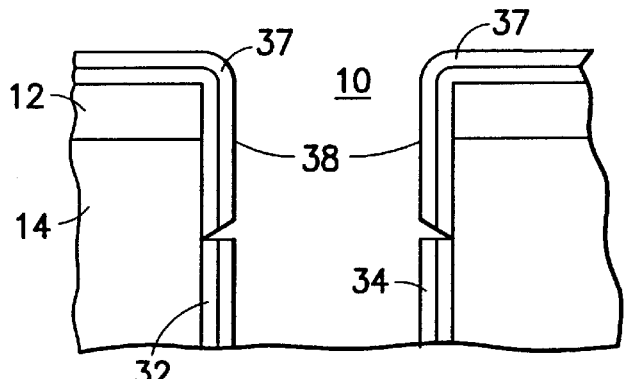

Referring to FIG. 17 and FIG. 18, the exposed portion of the silicon material layer 32 is oxidized 37 to form the dielectric collar 38. This may be accomplished by means of a wet or dry oxidation. The portion of the silicon material layer 32 protected by the oxidation barrier layer 34 remains unoxidized.

Figure 19:
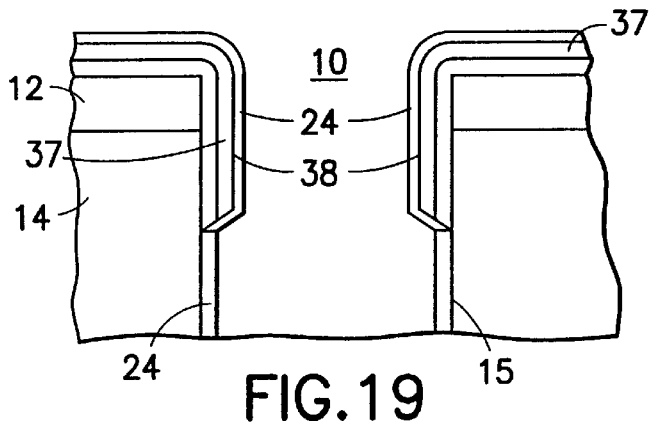

Referring to FIG. 19 the remaining oxidation barrier layer 34 and silicon material layer 32 in the trench 10 are removed selectively to the oxidized dielectric collar 38. This is accomplished by a conventional isotropic etch. A dopant source layer 24 is formed conformally on the trench sidewalls 15 and dielectric collar 38, by one of a number of alternative processes, preferably a layer of CVD ASG.

Figure 20:
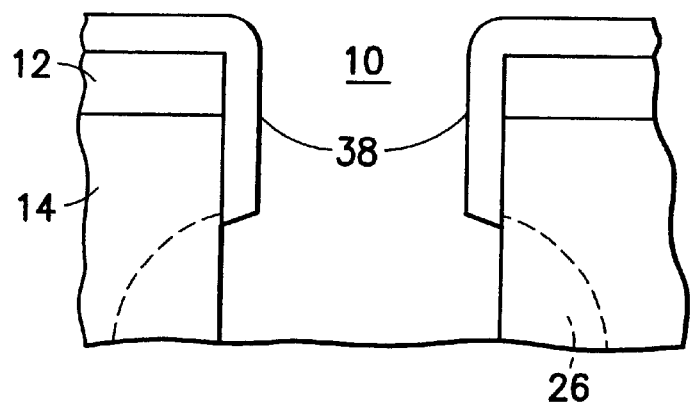

Referring to FIG. 19 and FIG. 20, outdiffusion of the dopant layer 24, into the semiconductor substrate 14, forms the buried plate electrode 26. Outdiffusion of the dopant layer 24 will only occur on the exposed silicon trench sidewalls 15. The dopant source layer 24 is subsequently removed. This can be accomplished by means of either a wet or dry isotropic etch process well known in the art.

Figure 21:
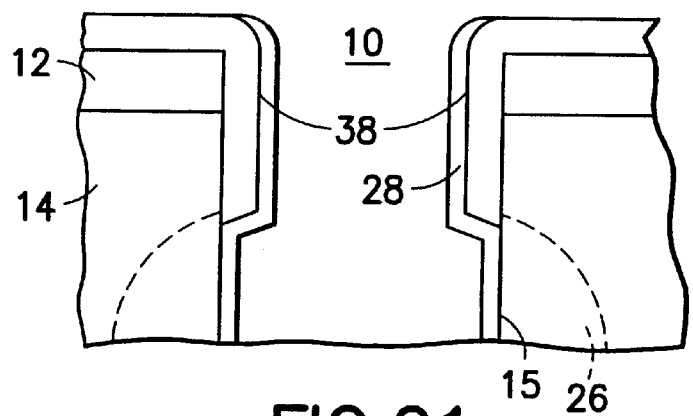

Referring to FIG. 21 the node dielectric 28, also referred to as the capacitor trench dielectric, is formed on the trench sidewalls 15. This is accomplished using a nitrogen containing gas, such as ammonia, to form a thin nitride layer. The surface of the nitride layer is then oxidized by means of an elevated oxidizing bake at 800–1100° C. by RTO or furnace anneal in a wet or dry $O_2$ ambient. The thickness of the node dielectric 28 is typically 20 to 50 Å.

Figure 22:
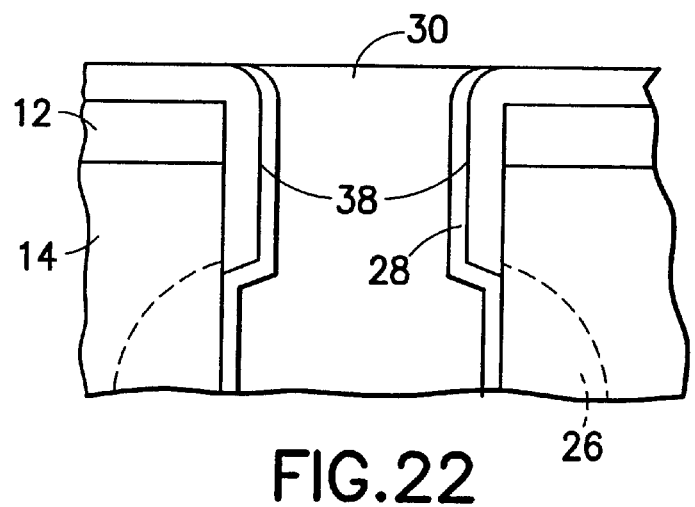
Figure 23:
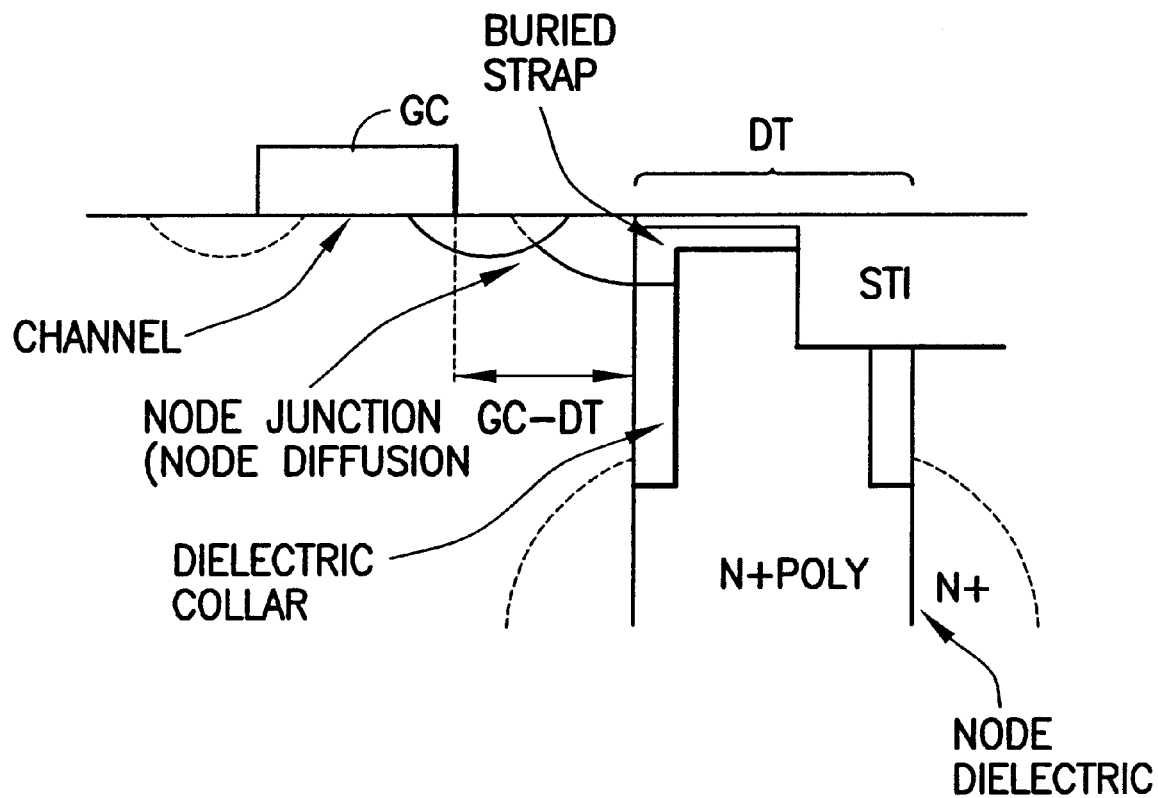
FIG. 23 shows a cross section of a conventional DRAM cell in more detail.

Referring to FIG. 21 and FIG. 22, the trench 10 is filled with a doped polysilicon 30 which forms the inner electrode, also referred to as the storage node, thereby completing the DT capacitor. This is accomplished by means of chemical vapor deposition processes (CVD) well known in the art for high aspect ratio applications.

In each of the first and second embodiments of the present invention, further conventional processing would take place through back end of line.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a deep trench collar in a semiconductor substrate, the method comprising the steps of:
    forming a trench having trench sidewalls in said semiconductor substrate;
    forming an oxidation barrier layer conformally on said trench sidewalls;
    filling said trench with a photoresist;
    removing said photoresist to a predetermined depth in said trench;
    removing said oxidation barrier layer to said predetermined depth in said trench to expose said trench sidewalls;
    removing the remaining photoresist in said trench;
    depositing a silicon material layer on said exposed trench sidewalls to said predetermined depth in trench;

forming a layer of dielectric on said silicon material layer to said predetermined depth in trench to form a collar; and removing the remaining oxidation barrier layer in said trench.

2. The method of claim 1 further comprising the steps of:

forming a buried plate electrode within said trench;

forming a dielectric node in said trench; and filling said trench with polysilicon.

3. The method of claim 1 wherein said trench is formed by etching.

4. The method of claim 1 wherein said oxidation barrier layer is a nitride barrier layer.

5. The method of claim 1 wherein said silicon material layer is an epitaxial silicon layer.

6. The method of claim 1 wherein said dielectric collar is formed by the oxidation of said layer of silicon material.

7. A method of forming a deep trench collar in a semiconductor substrate, the method comprising the steps of:

forming a trench having trench sidewalls in said semiconductor substrate;

forming a layer of silicon material conformally on said trench sidewalls;

forming an oxidation barrier layer conformally on said layer of silicon material;

filling said trench with a photoresist;

removing said photoresist to a predetermined depth;

removing said oxidation barrier layer to said predetermined depth in said trench;

removing the remaining photoresist in said trench;

forming a layer of dielectric on said layer of silicon material to said predetermined depth to form a collar;

removing the remaining oxidation barrier layer; and removing the remaining layer of silicon material underneath the remaining oxidation barrier layer.

8. The method of claim 7 further comprising the steps of:

forming a buried plate electrode within said trench;

forming a dielectric node in said trench; and filling said trench with polysilicon.

9. The method of claim 7 wherein the said trench is formed by etching.

10. The method of claim 7 wherein said layer of silicon material is amorphous.

11. The method of claim 7 wherein said layer of silicon material is polysilicon.

12. The method of claim 7 wherein said layer of silicon material is epitaxial silicon.

13. The method of claim 7 wherein said layer of silicon material is undoped.

14. The method of claim 7 wherein said layer of silicon material is lightly P-doped.

15. The method of claim 7 wherein said oxidation barrier layer is a layer of silicon nitride.

16. The method of claim 7 wherein said dielectric collar is formed by the oxidation of said layer of silicon material.

* * * * *